(12) United States Patent  (10) Patent No.: US 12,431,934 B2
Uejima et al.  (45) Date of Patent: Sep. 30, 2025

(54) RADIO-FREQUENCY MODULE AND COMMUNICATION APPARATUS

(71) Applicant: Murata Manufacturing Co., Ltd., Kyoto (JP)

(72) Inventors: Takanori Uejima, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 387 days.

(21) Appl. No.: 18/168,034

(22) Filed: Feb. 13, 2023

(65) Prior Publication Data

US 2023/0208467 A1  Jun. 29, 2023

Related U.S. Application Data

(63) Continuation of application No. PCT/JP2021/032760, filed on Sep. 7, 2021.

(30) Foreign Application Priority Data

Sep. 25, 2020  (JP) .................................. 2020-160619

(51) Int. Cl.
  *H04B 1/40*  (2015.01)
  *H05K 1/02*  (2006.01)
  *H05K 1/11*  (2006.01)

(52) U.S. Cl.
  CPC ............. *H04B 1/40* (2013.01); *H05K 1/0243* (2013.01); *H05K 1/115* (2013.01)

(58) Field of Classification Search
  CPC ... H04B 1/40; H04B 1/00; H04B 1/38; H05K 1/0243; H05K 1/115; H01L 23/3121;
  (Continued)

(56) References Cited

U.S. PATENT DOCUMENTS 6,486,548 B1 * 11/2002 Nakatsu ................ H01L 25/072
  257/729
2006/0104468 A1 * 5/2006 Yamamoto ........... H04R 19/016
  381/361
(Continued)

FOREIGN PATENT DOCUMENTS

CN  1270702 A  10/2000
CN  103503228 A  1/2014
(Continued)

OTHER PUBLICATIONS

International Search Report for PCT/JP2021/032760 dated Nov. 9, 2021.

*Primary Examiner* — Eugene Yun
(74) *Attorney, Agent, or Firm* — McDonald Hopkins LLC (57) ABSTRACT

A radio-frequency module includes: a module substrate having a major face; a first circuit component and a second circuit component that are disposed over the major face; and a metal shield plate disposed over the major face and set to a ground potential. The metal shield plate includes a shield part extending in a direction perpendicular to the major face, and a joint part parallel to the major face and spaced apart from the major face, the joint part extending from the shield part. A top face of at least one of the first circuit component and the second circuit component is connected with the joint part by a bonding wire. With the module substrate seen in plan view, the metal shield plate is disposed between the first circuit component and the second circuit component.

15 Claims, 4 Drawing Sheets

(58) Field of Classification Search
CPC ... H01L 23/5383; H01L 23/66; H01L 23/552; H03F 2200/451; H03F 1/565; H03F 3/195; H03F 3/245; H03H 9/25
USPC .......................................................... 455/73
See application file for complete search history.

(56) References Cited

U.S. PATENT DOCUMENTS

| | | |
|---|---|---|
| 2013/0043946 A1 | 2/2013 | Hadjichristos et al. |
| 2013/0331043 A1* | 12/2013 | Perumana .............. H04B 1/525 455/78 |
| 2015/0119102 A1 | 4/2015 | Saji et al. |
| 2022/0320743 A1* | 10/2022 | Igarashi ................... H01Q 5/35 |

FOREIGN PATENT DOCUMENTS

| | | |
|---|---|---|
| JP | 2005-05974 A | 2/2005 |
| JP | 2014-522216 A | 8/2014 |
| JP | 2015-111803 A | 6/2015 |
| JP | 2018-067644 A | 4/2018 |
| WO | 99/21228 A1 | 4/1999 |

\* cited by examiner

RADIO-FREQUENCY MODULE AND COMMUNICATION APPARATUS

CROSS REFERENCE TO RELATED APPLICATION

This is a continuation of International Application No. PCT/JP2021/032760 filed on Sep. 7, 2021 which claims priority from Japanese Patent Application No. 2020-160619 filed on Sep. 25, 2020. The contents of these applications are incorporated herein by reference in their entireties.

BACKGROUND ART

Technical Field

The present disclosure relates to a radio-frequency module, and a communication apparatus.

As mobile communication apparatuses such as mobile phones are becoming, in particular, increasingly multiband, the arrangement and configuration of circuit elements constituting the radio-frequency front-end circuit of such apparatuses are becoming increasingly complex.

Patent Document 1 discloses a circuit configuration of a transceiver (transmit and receive circuit) including the following components: a plurality of transmitters (transmit paths); a plurality of receivers (receive paths); and a switchplexer (antenna switch) disposed between an antenna, and the transmitters and the receivers. Each of the transmitters includes a transmit circuit, a transmit power amplifier (PA), and an output circuit. Each of the receivers includes a receive circuit, a receive low-noise amplifier (LNA), and an input circuit. The output circuit includes components, such as a transmit filter, an impedance matching circuit, and a duplexer. The input circuit includes components, such as a receive filter, an impedance matching circuit, and a duplexer. The above-mentioned configuration allows simultaneous transmission, simultaneous reception, or simultaneous transmission and reception to be executed through the switching action of the switchplexer.

Patent Document 1: Japanese Unexamined Patent Application Publication (Translation of PCT Application) No. 2014-522216

BRIEF SUMMARY

One potential issue with implementing the transceiver (transmit and receive circuit) disclosed in Patent Document 1 by a radio-frequency module incorporated in a mobile communication apparatus would be that electromagnetic coupling may occur between at least two of circuit components disposed in each of the transmit path, the receive path, and the transmit and receive path including the antenna switch. In this case, the harmonic wave components of the transmit signal at high output power that has been amplified in the PA (transmit power amplifier) may become superposed on the transmit signal, leading to potential deterioration in the quality of the transmit signal. The electromagnetic coupling may also lead to reduced isolation between the transmit and receive sides. As a result, the harmonic waves mentioned above, or spurious waves such as intermodulation distortion between the transmit signal and another radio-frequency signal may leak into the receive path, leading to potential deterioration of reception sensitivity. The above-mentioned electromagnetic coupling may also result in interference between two receive signals, and consequently deterioration of reception sensitivity. Further, disposing the above-mentioned circuit components on a surface of the module substrate results in increased area required for laying out the electrodes of the circuit components, which makes it difficult to achieve miniaturization of the module substrate.

The present disclosure has been made to address the above-mentioned problems. The present disclosure provides a radio-frequency module and a communication apparatus that are compact, and that allow for reduced deterioration in the quality of a transmit signal or a receive signal.

A radio-frequency module according to an aspect of the present disclosure includes: a module substrate having a major face; a first circuit component and a second circuit component that are disposed over the major face; and a metal plate disposed over the major face and set to a ground potential. The metal plate includes a body part extending in a direction perpendicular to the major face, and a first joint part parallel to the major face and spaced apart from the major face, the first joint part extending from the body part. A top face of at least one of the first circuit component and the second circuit component is connected with the first joint part by a bonding wire. With the module substrate seen in plan view, the metal plate is disposed between the first circuit component and the second circuit component.

The present disclosure makes it possible to provide a radio-frequency module and a communication apparatus that are compact, and that allow for reduced deterioration in the quality of a transmit signal or a receive signal.

DETAILED DESCRIPTION

Embodiments of the present disclosure will be described below in detail. The embodiments described below represent generic or specific examples. Features presented in the following description of embodiments, inventive examples, and modifications, such as numerical values, shapes, materials, components, and the arrangement and connection of components, are illustrative only and not intended to be limiting of the present disclosure. Of the components presented in the following description of embodiments and inventive examples, those components not described in independent claims will be described as optional components. The sizes of components illustrated in the drawings or the ratios between the sizes of these components are not necessarily drawn to scale. Throughout the drawings, identical reference signs are used to designate substantially identical features, and repetitive description will be sometimes omitted or simplified.

In the following description, "parallel", "perpendicular", or other such terms indicative of the relationship between elements, "rectangular" or other such terms indicative of a shape of an element, and numerical ranges are not intended to represent only their strict meanings but are meant to also include their substantial equivalents, for example, equivalents with deviations of about a few percent.

In the figures below, an x-axis and a y-axis are mutually orthogonal axes in a plane parallel to the major face of a module substrate. A z-axis is an axis perpendicular to the major face of the module substrate. The z-axis has a positive direction defined as an upward direction, and a negative direction defined as a downward direction.

As used in the following description of the circuit configuration according to the present disclosure, the term "connected" means not only that circuit components are directly connected with each other by a connection terminal or a wiring conductor but also that circuit components are electrically connected with each other with another circuit component interposed therebetween. The expression "connected between A and B" means being located between A and B and connected with both A and B.

As used in the following description of the module configuration according to the present disclosure, expressions such as "in plan view" mean an orthographic projection of an object onto an xy-plane from the positive side of the z-axis. Expressions such as "a component is disposed over or in a major face of a substrate" include not only that the component is disposed on top of the major face of the substrate in contact with the major face, but also that the component is disposed above the major face without necessarily contact with the major face, and that the component is disposed with a portion thereof partially embedded into the substrate from the major face. Expressions such as "A is connected between B and C" mean that at least one of line segments connecting between a given point in B and a given point in C passes through A. Further, "parallel", "perpendicular", or other such terms indicative of the relationship between elements, and "rectangular" or other such terms indicative of a shape of an element are not intended to represent only their strict meanings but are meant to also include their substantial equivalents, for example, equivalents with deviations or differences of about a few percent.

As used in the following description, the term "transmit path" means a transfer line including, for example, wiring for transferring a radio-frequency transmit signal, an electrode directly connected with the wiring, and a terminal directly connected with the wiring or the electrode. The term "receive path" means a transfer line including, for example, wiring for transferring a radio-frequency receive signal, an electrode directly connected with the wiring, and a terminal directly connected with the wiring or the electrode. The term "transmit and receive path" means a transfer line including, for example, wiring for transferring a radio-frequency transmit signal and a radio-frequency receive signal, an electrode directly connected with the wiring, and a terminal directly connected with the wiring or the electrode.

EMBODIMENT

1. Circuit Configurations of Radio-Frequency Module 1 and Communication Apparatus 5

Figure 1:
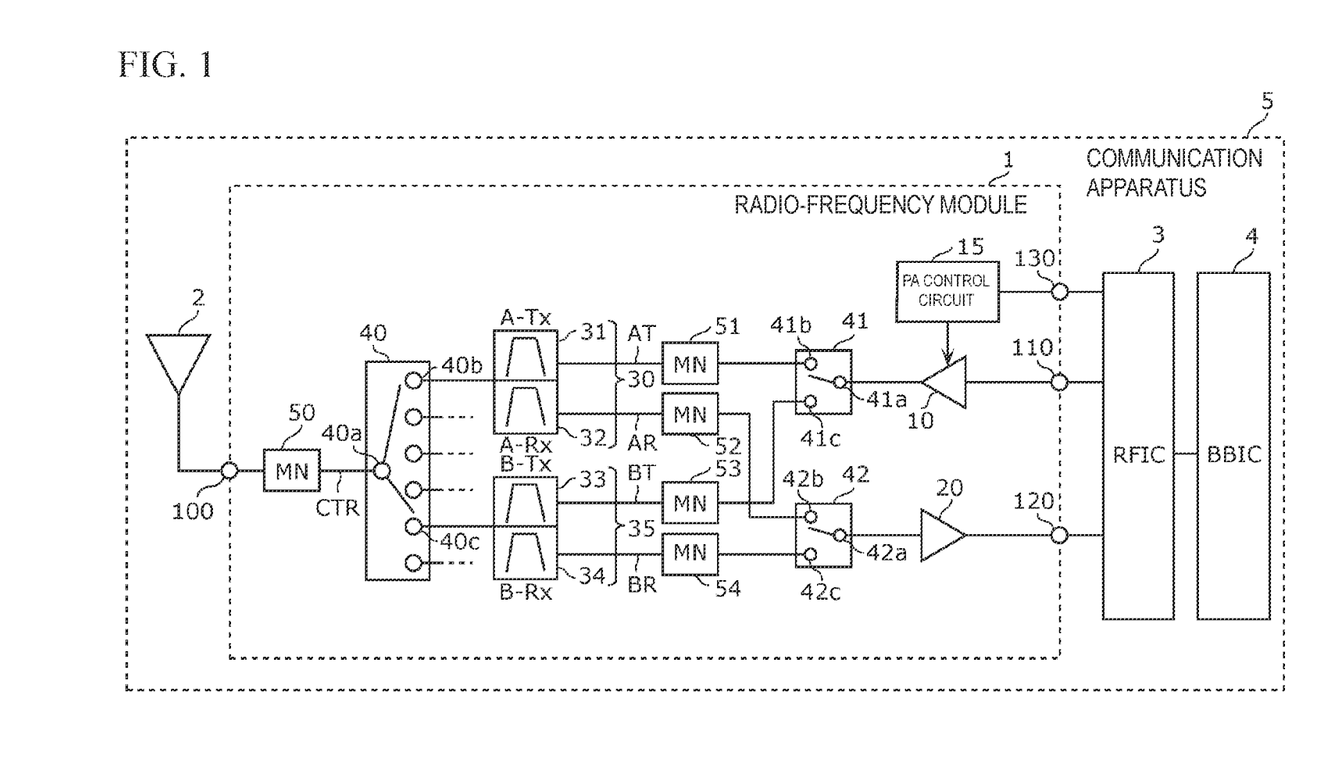
FIG. 1 illustrates the circuit configurations of a radio-frequency module and a communication apparatus according to an embodiment.

FIG. 1 illustrates the circuit configurations of a radio-frequency module 1 and a communication apparatus 5 according to an embodiment. As illustrated in FIG. 1, the communication apparatus 5 includes the radio-frequency module 1, an antenna 2, a radio-frequency integrated circuit (RFIC) 3, and a baseband integrated circuit (BBIC) 4.

The RFIC 3 represents a circuit that processes radio-frequency signals transmitted and received by the antenna 2. Specifically, the RFIC 3 applies signal processing such as down-conversion to a radio-frequency receive signal input via a receive signal path of the radio-frequency module 1, and outputs the processed receive signal to the BBIC 4. The RFIC 3 also applies signal processing such as up-conversion to a transmit signal input from the BBIC 4, and outputs the processed radio-frequency transmit signal to a transmit signal path of the radio-frequency module 1.

The BBIC 4 is a circuit that processes a signal by using a band of intermediate frequencies lower than the frequencies of radio-frequency signals that propagate in the radio-frequency module 1. The signal processed by the BBIC 4 is used as, for example, a video signal for image display, or as an audio signal for telephone conversation using a speaker.

The RFIC 3 also serves as a controller that, based on the communication band (frequency band) to be used, controls the connections of switches 40, 41 and 42 included in the radio-frequency module 1. Specifically, the RFIC 3 switches the connections of the switches 40 to 42 of the radio-frequency module 1 by a control signal (not illustrated). Specifically, the RFIC 3 outputs a digital control signal for controlling the switches 40 to 42 to a PA control circuit 15. By the digital control signal input from the RFIC 3, the PA control circuit 15 of the radio-frequency module 1 controls the connection and non-connection of the switches 40 to 42 by outputting the digital control signal to the switches 40 to 42.

The RFIC 3 also serves as a controller that controls the gain of a power amplifier 10 of the radio-frequency module 1, and a power supply voltage Vcc and a bias voltage Vbias that are to be supplied to the power amplifier 10. Specifically, the RFIC 3 outputs a digital control signal to a control signal terminal 130 of the radio-frequency module 1. By using the digital control signal input via the control signal terminal 130, the PA control circuit 15 adjusts the gain of the power amplifier 10 by outputting a control signal, the power supply voltage Vcc, or the bias voltage Vbias to the power amplifier 10. The controller mentioned above may be provided outside the RFIC 3, for example, in the BBIC 4.

The antenna 2 is connected with an antenna connection terminal 100 of the radio-frequency module 1. The antenna 2 radiates a radio-frequency signal output from the radio-frequency module 1. The antenna 2 also receives an extraneous radio-frequency signal, and outputs the received radio-frequency signal to the radio-frequency module 1.

The communication apparatus 5 according to the embodiment is not necessarily required to include the antenna 2 and the BBIC 4.

Reference is now made to a detailed configuration of the radio-frequency module 1.

As illustrated in FIG. 1, the radio-frequency module 1 includes the following components: the power amplifier 10, a low-noise amplifier 20, the PA control circuit 15, transmit filters 31 and 33, receive filters 32 and 34, matching circuits 50, 51, 52, 53, and 54, the switches 40, 41 and 42, the antenna connection terminal 100, a transmit input terminal 110, a receive output terminal 120, and the control signal terminal 130.

The antenna connection terminal 100 is connected with the antenna 2. The transmit input terminal 110 is a terminal for receiving a transmit signal from a source (RFIC 3) external to the radio-frequency module 1. The receive output terminal 120 is a terminal for supplying a receive signal to a destination (RFIC 3) external to the radio-frequency module 1.

The power amplifier 10 is a transmit amplifier that amplifies transmit signals that are in a communication band A and a communication band B. The power amplifier 10 has an input terminal that is connected with the transmit input terminal 110, and an output terminal that is connected with each of the matching circuits 51 and 53 with the switch 41 interposed therebetween.

The low-noise amplifier 20 is a receive amplifier that provides low-noise amplification of receive signals that are in the communication band A and the communication band B. The low-noise amplifier 20 has an input terminal that is connected with each of the matching circuits 52 and 54 with the switch 42 interposed therebetween, and an output terminal that is connected with the receive output terminal 120.

The PA control circuit 15 adjusts the gain of the power amplifier 10 by, for example, a digital control signal MIPI input via the control signal terminal 130. The PA control circuit 15 may be a semiconductor integrated circuit (IC). The semiconductor IC is implemented as, for example, a complementary metal oxide semiconductor (CMOS). Specifically, the semiconductor IC is formed by a silicon-on-insulator (SOI) process. This allows for inexpensive manufacture of the semiconductor IC. The semiconductor IC may be made of at least one of GaAs, SiGe, and GaN. This makes it possible to output a radio-frequency signal with improved amplification performance and improved noise performance.

The transmit filter 31 is disposed in a transmit path AT that connects the power amplifier 10 with the switch 40. The transmit filter 31 is capable of passing, from among transmit signals amplified in the power amplifier 10, a transmit signal in a transmit band that coincides with the communication band A. The transmit filter 33 is disposed in a transmit path BT that connects the power amplifier 10 with the switch 40. The transmit filter 33 is capable of passing, from among transmit signals amplified in the power amplifier 10, a transmit signal in a transmit band that coincides with the communication band B.

The receive filter 32 is disposed in a receive path AR that connects the low-noise amplifier 20 with the switch 40. The receive filter 32 is capable of passing, from among receive signals input from the antenna connection terminal 100, a receive signal in a receive band that coincides with the communication band A. The receive filter 34 is disposed in a receive path BR that connects the low-noise amplifier 20 with the switch 40. The receive filter 34 is capable of passing, from among receive signals input from the antenna connection terminal 100, a receive signal in a receive band that coincides with the communication band B.

Non-limiting suitable examples of the transmit filters 31 and 33 and the receive filters 32 and 34 may include: surface acoustic wave filters; acoustic wave filters employing bulk acoustic waves (BAWs); LC resonant filters; and dielectric filters.

The transmit filter 31 and the receive filter 32 constitute a duplexer 30 with a pass band that coincides with the communication band A. The transmit filter 33 and the receive filter 34 constitute a duplexer 35 with a pass band that coincides with the communication band B.

Each of the duplexers 30 and 35 may be a single filter that transfers data by use of the time division duplex (TDD) method. In this case, a switch for switching between transmission and reception is disposed in at least one of the following locations: the location preceding the single filter; and the location subsequent to the single filter.

The matching circuit 50 is disposed in a transmit and receive path CTR that connects the antenna connection terminal 100 with the switch 40. The matching circuit 50 performs impedance matching between the antenna 2, the switch 40, and the duplexers 30 and 35. The matching circuit 50 includes at least one inductor. The matching circuit 50 may be disposed in series with the transmit and receive path CTR, or may be connected between the transmit and receive path CTR and ground.

The matching circuit 51 is disposed in the transmit path AT that connects the power amplifier 10 with the transmit filter 31. The matching circuit 51 performs impedance matching between the power amplifier 10 and the transmit filter 31. The matching circuit 51 includes at least one inductor. The matching circuit 51 may be disposed in series with the transmit path AT, or may be connected between the transmit path AT and ground.

The matching circuit 53 is disposed in the transmit path BT that connects the power amplifier 10 with the transmit filter 33. The matching circuit 53 performs impedance matching between the power amplifier 10 and the transmit filter 33. The matching circuit 53 includes at least one inductor. The matching circuit 53 may be disposed in series with the transmit path BT, or may be connected between the transmit path BT and ground.

The matching circuit 52 is disposed in the receive path AR that connects the low-noise amplifier 20 with the receive filter 32. The matching circuit 52 performs impedance matching between the low-noise amplifier 20 and the receive filter 32. The matching circuit 52 includes at least one inductor. The matching circuit 52 may be disposed in series with the receive path AR, or may be connected between the receive path AR and ground.

The matching circuit 54 is disposed in the receive path BR that connects the low-noise amplifier 20 with the receive filter 34. The matching circuit 54 performs impedance matching between the low-noise amplifier 20 and the receive filter 34. The matching circuit 54 includes at least one inductor. The matching circuit 54 may be disposed in series with the receive path BR, or may be connected between the receive path BR and ground.

Instead of or in addition to the matching circuits 51 and 53, a matching circuit may be disposed in the transmit path between the power amplifier 10 and the switch 41.

The switch 40 includes a common terminal 40*a*, and selection terminals 40*b* and 40*c*. The common terminal 40*a* is connected with the antenna connection terminal 100 with the matching circuit 50 interposed therebetween. The selection terminal 40*b* is connected with the duplexer 30, and the selection terminal 40*c* is connected with the duplexer 35. That is, the switch 40 is an antenna switch disposed between the antenna connection terminal 100 and each of the duplexers 30 and 35. The switch 40 serves to: (1) switch whether to connect the antenna connection terminal 100 with the duplexer 30; and (2) whether to connect the antenna connection terminal 100 with the duplexer 35. The switch 40 is implemented as a multi-connection switching circuit capable of simultaneously establishing the connections mentioned in the items (1) and (2) above.

Instead of or in addition to the matching circuits 52 and 54, a matching circuit may be disposed in the receive path between the low-noise amplifier 20 and the switch 42.

Instead of or in addition to the matching circuit 50, a matching circuit may be disposed in each of the transmit and receive path that connects the switch 40 with the duplexer 30, and the transmit and receive path that connects the switch 40 with the duplexer 35.

The switch 41 includes a common terminal 41*a*, and selection terminals 41*b* and 41*c*. The switch 41 is disposed in the transmit path that connects the power amplifier 10 with each of the transmit filters 31 and 33. The switch 41 switches whether to connect the power amplifier 10 with the transmit filter 31, and whether to connect the power amplifier 10 with the transmit filter 33. The switch 41 is implemented as, for example, a single-pole double-throw (SPDT) switching circuit. The common terminal 41*a* of the switch 41 is connected with the output terminal of the power amplifier 10, the selection terminal 41*b* is connected with the transmit filter 31 with the matching circuit 51 interposed therebetween, and the selection terminal 41*c* is connected with the transmit filter 33 with the matching circuit 53 interposed therebetween.

The switch 42 includes a common terminal 42*a*, and selection terminals 42*b* and 42*c*. The switch 42 is disposed in the receive path that connects the low-noise amplifier 20 with each of the receive filters 32 and 34. The switch 42 switches whether to connect the low-noise amplifier 20 with the receive filter 32, and whether to connect the low-noise amplifier 20 with the receive filter 34. The switch 42 is implemented as, for example, a single-pole double-throw (SPDT) switching circuit. The common terminal 42*a* of the switch 42 is connected with the input terminal of the low-noise amplifier 20, the selection terminal 42*b* is connected with the receive filter 32 with the matching circuit 52 interposed therebetween, and the selection terminal 42*c* is connected with the receive filter 34 with the matching circuit 54 interposed therebetween.

The transmit path AT is a signal path to transfer a transmit signal in the communication band A, and to connect the transmit input terminal 110 with the common terminal 40*a* of the switch 40. The transmit path BT is a signal path to transfer a transmit signal in the communication band B, and to connect the transmit input terminal 110 with the common terminal 40*a* of the switch 40. The receive path AR is a signal path to transfer a receive signal in the communication band A, and to connect the receive output terminal 120 with the common terminal 40*a* of the switch 40. The receive path BR is a signal path to transfer a receive signal in the communication band B, and to connect the receive output terminal 120 with the common terminal 40*a* of the switch 40. The transmit and receive path CTR is a signal path to transfer transmit and receive signals in the communication band A, to transfer transmit and receive signals in the communication band B, and to connect the antenna connection terminal 100 with the common terminal 40*a* of the switch 40.

In the radio-frequency module 1 with the circuit configuration mentioned above, the power amplifier 10, the switch 41, the matching circuit 51, and the transmit filter 31 constitute a first transmit circuit that outputs a transmit signal in the communication band A toward the antenna connection terminal 100. The power amplifier 10, the switch 41, the matching circuit 53, and the transmit filter 33 constitute a second transmit circuit that outputs a transmit signal in the communication band B toward the antenna connection terminal 100.

The low-noise amplifier 20, the switch 42, the matching circuit 52, and the receive filter 32 constitute a first receive circuit that receives a receive signal in the communication band A from the antenna 2 via the antenna connection terminal 100. The low-noise amplifier 20, the switch 42, the matching circuit 54, and the receive filter 34 constitute a second receive circuit that receives a receive signal in the communication band B from the antenna 2 via the antenna connection terminal 100.

The circuit configuration mentioned above allows the radio-frequency module 1 according to the embodiment to execute at least one of the following operations: (1) transmission and reception of a radio-frequency signal in the communication band A; (2) transmission and reception of a radio-frequency signal in the communication band B; and (3) simultaneous transmission, simultaneous reception, or simultaneous transmission and reception of a radio-frequency signal in the communication band A and a radio-frequency signal in the communication band B.

In the radio-frequency module according to the present disclosure, each of the transmit circuit and the receive circuit does not have to be connected with the antenna connection terminal 100 with the switch 40 interposed therebetween. Alternatively, each of the transmit circuit and the receive circuit may be connected with the antenna 2 with a different terminal interposed therebetween. As for the circuit configuration of the radio-frequency module according to the present disclosure, the radio-frequency module may simply include at least two of a transmit path, a receive path, and a transmit and receive path, and matching circuits disposed in the two paths. The radio-frequency module may simply include one of the first transmit circuit and the second transmit circuit. The radio-frequency module may simply include one of the first receive circuit and the second receive circuit.

One potential issue with the radio-frequency module 1 having the circuit configuration mentioned above is that if electromagnetic coupling occurs between at least two of circuit components disposed in each of the transmit path, the receive path, and the transmit and receive path, harmonic wave components of the transmit signal at high output power that has been amplified in the power amplifier may become superposed on the transmit signal, leading to deterioration in the quality of the transmit signal. Another potential issue is that the above-mentioned electromagnetic coupling may result in reduced isolation between the transmit and receive sides. As a result, the above-mentioned harmonic waves, or spurious waves such as intermodulation distortion between the transmit signal and another radio-frequency signal may leak into the receive path, leading to deterioration of reception sensitivity. Another potential issue is that the above-mentioned electromagnetic coupling may result in interference between two receive signals, which may lead to deterioration of reception sensitivity. Further, disposing the above-mentioned circuit components on a surface of the module substrate results in increased area required for laying out the electrodes of the circuit components, which makes it difficult to achieve miniaturization of the module substrate.

To address these issues, the radio-frequency module 1 according to the embodiment is designed to have a configuration that makes it possible to reduce the above-mentioned electromagnetic coupling while also allowing for miniaturization. Reference is now made to how the radio-frequency module 1 according to the embodiment is configured to reduce the above-mentioned electromagnetic coupling while allowing for miniaturization.

Figure 2:
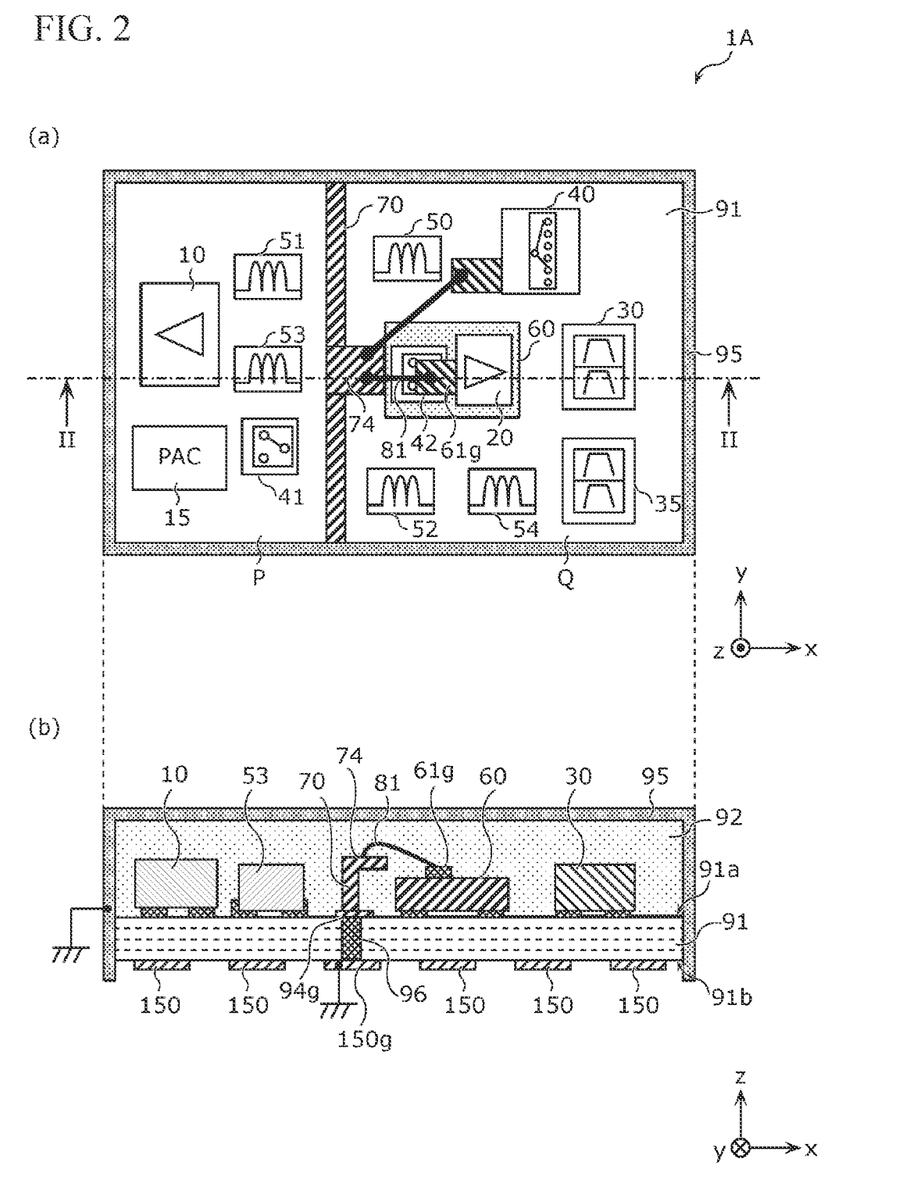
FIG. 2 illustrates, in plan and in cross-section, a radio-frequency module according to an inventive example.

2. Arrangement of Circuit Components of Radio-Frequency Module 1A According to Inventive Example FIG. 2 illustrates, in plan and in cross-section, a radio-frequency module 1A according to an inventive example. Part (a) of FIG. 2 illustrates an arrangement of circuit components with a major face 91*a* of a module substrate 91 viewed from the positive side in the direction of the z-axis. Part (b) of FIG. 2 illustrates a cross-section taken along a line II-II in part (a) of FIG. 2. The radio-frequency module 1A represents a specific arrangement of circuit components constituting the radio-frequency module 1 according to the embodiment.

As illustrated in FIG. 2, the radio-frequency module 1A according to the inventive example further includes the following components in addition to the circuit configurations illustrated in FIG. 1: the module substrate 91, a metal shield plate 70, a metal shield layer 95, a via-conductor 96, a resin component 92, and external connection terminals 150.

The module substrate 91 is a substrate having the major face 91a on which to mount the first and second transmit circuits and the first and second receive circuits. Non-limiting examples of the module substrate 91 include the following substrates with a multilayer structure of a plurality of dielectric layers; low temperature co-fired ceramic (LTCC) substrates; high temperature co-fired ceramic (HTCC) substrates; substrates with embedded components; substrates with a redistribution layer (RDL); and printed circuit boards. The antenna connection terminal 100, the transmit input terminal 110, the receive output terminal 120, and the control signal terminal 130 may be provided over the module substrate 91.

The resin component 92 is disposed over the major face 91a of the module substrate 91. The resin component 92 covers at least part of circuit components constituting the first and second transmit circuits, at least part of circuit components constituting the first and second receive circuits, and the major face 91a of the module substrate 91. The resin component 92 serves to ensure the reliability of the above-mentioned circuit components, such as mechanical strength and moisture resistance.

The external connection terminals 150 are disposed over the major face 91b of the module substrate 91. The radio-frequency module 1A exchanges electrical signals through the external connection terminals 150 with an external substrate that is located on the negative side in the direction of the z-axis relative to the radio-frequency module 1A. Among the external connection terminals 150, a ground terminal 150g is a ground terminal set to the ground potential of the external substrate. The external connection terminals 150 may be flat electrodes disposed over the major face 91b as illustrated in FIG. 2, or may be bump electrodes disposed over the major face 91b.

The metal shield layer 95 is an example of a metal layer. The metal shield layer 95 covers the surface of the resin component 92, and is set to the ground potential. The metal shield layer 95 is, for example, a metallic thin film formed by sputtering.

The radio-frequency module 1A may have no resin component 92 and no metal shield layer 95.

The via-conductor 96 is disposed in the module substrate 91, and extends in a direction that crosses the major face 91a. The via-conductor 96 is set to the ground potential of the radio-frequency module 1A. According to the inventive example, the via-conductor 96 extends in a direction orthogonal to the major face 91a, and penetrates the module substrate 91.

The metal shield plate 70 is an example of a metal plate. The metal shield plate 70 is a metal wall that extends from the major face 91a toward a top face of the resin component 92 located on the positive side in the direction of the z-axis. The metal shield plate 70 is set to the ground potential.

Figure 3A:
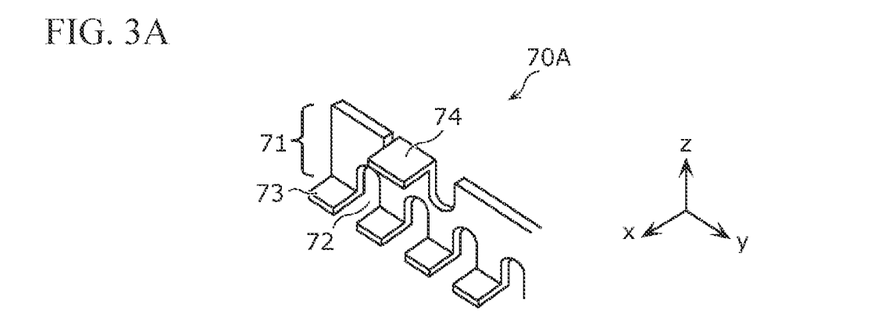
FIG. 3A is a perspective exterior view of a first example of a metal shield plate.

FIG. 3A is a perspective exterior view of a first example of the metal shield plate 70. A metal shield plate 70A illustrated in FIG. 3A is an example of the metal shield plate 70 according to the inventive example. As illustrated in FIG. 3A, the metal shield plate 70A includes a shield part 71, and joint parts 73 and 74. The shield part 71 is an example of a body part of the metal shield plate 70A. The shield part 71 extends in a direction perpendicular to the major face 91a (i.e., in the direction of the z-axis). The joint part 74 is an example of a first joint part. The joint part 74 is parallel to the major face 91a and spaced apart from the major face 91a, and extends from the shield part 71. The joint part 73 is an example of a second joint part. The joint part 73 is parallel to the major face 91a and spaced apart from the major face 91a, and extends from the shield part 71. Further, a hole 72 is provided between the metal shield plate 70A and the major face 91a. The hole 72 penetrates the shield part 71 in the direction of the normal to the shield part 71 (i.e., in the direction of the x-axis). The shield part 71 is not connected at the upper end with the metal shield layer 95.

The joint part 74 has a surface to which a bonding wire is joined. The joint part 74 is not in contact with the metal shield layer 95. The joint part 74 is thus connected by the bonding wire with a circuit component disposed over the major face 91a. This allows the joint part 74 to serve as a ground electrode for setting the circuit component to the ground potential. This in turn obviates the need to provide the ground electrode over the major face 91a. This results in reduced area required for laying out such a ground electrode over the major face 91a, which allows for miniaturization of the module substrate 91.

As described above, the metal shield plate 70A and the major face 91a are joined with each other by the joint part 73. This improves the accuracy of placement of the metal shield plate 70A, and the strength of the joining between the metal shield plate 70A and the major face 91a. Further, the presence of the hole 72 helps to ensure, in forming the resin component 92 over the major face 91a, good flowability of liquid resin in the vicinity of the metal shield plate 70A. This in turn helps to reduce occurrence, in the vicinity of the metal shield plate 70A, of voids or other areas where no resin component 92 is present.

Although the metal shield plate 70A is necessarily required to include the shield part 71 and the joint part 74, the metal shield plate 70A may include no joint part 73. Further, the metal shield plate 70A may have no hole 72.

Figure 3B:
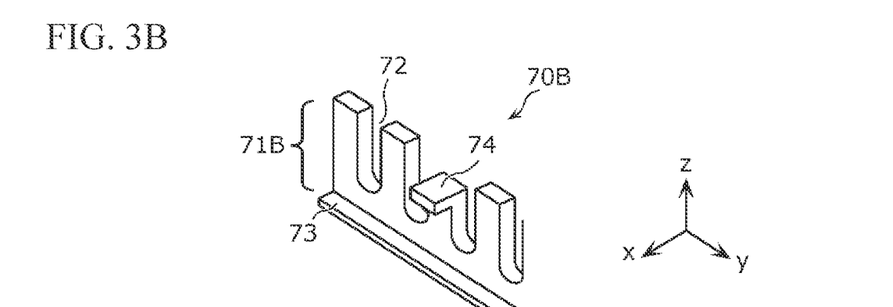
FIG. 3B is a perspective exterior view of a second example of the metal shield plate.

FIG. 3B is a perspective exterior view of a second example of the metal shield plate 70. A metal shield plate 70B illustrated in FIG. 3B is an example of the metal shield plate 70 according to the inventive example. As illustrated in FIG. 3B, the metal shield plate 70B includes a shield part 71B, and joint parts 73 and 74. The shield part 71B is an example of a body part of the metal shield plate 70B. The shield part 71B extends in a direction perpendicular to the major face 91a (i.e., in the direction of the z-axis). The joint part 74 is an example of a first joint part. The joint part 74 is parallel to the major face 91a and spaced apart from the major face 91a, and extends from the shield part 71B. The joint part 73 is an example of a second joint part. The joint part 73 is parallel to the major face 91a and spaced apart from the major face 91a, and extends from the shield part 71B. The shield part 71B is connected at the upper end with the metal shield layer 95. Further, a hole 72 is provided between the metal shield plate 70B and the metal shield layer 95. The hole 72 penetrates the shield part 71B in the direction of the normal to the shield part 71B (i.e., in the direction of the x-axis).

The joint part 74 has a surface to which a bonding wire is joined. The joint part 74 is not in contact with the metal shield layer 95. The joint part 74 is thus connected by the bonding wire with a circuit component disposed over the major face 91a. This allows the joint part 74 to serve as a ground electrode for setting the circuit component to the ground potential. This in turn obviates the need to provide the ground electrode over the major face 91a. This results in reduced area required for laying out such a ground electrode over the major face 91a, which allows for miniaturization of the module substrate 91.

As described above, the metal shield plate 70B and the major face 91a are joined with each other by the joint part 73. This improves the accuracy of placement of the metal shield plate 70B, and the strength of the joining between the metal shield plate 70B and the major face 91a. Further, the presence of the hole 72 helps to ensure, in forming the resin component 92 over the major face 91a, good flowability of liquid resin in the vicinity of the metal shield plate 70B. This in turn helps to reduce occurrence, in the vicinity of the metal shield plate 70B, of voids or other areas where no resin component 92 is present.

Although the metal shield plate 70B is necessarily required to include the shield part 71B and the joint part 74, the metal shield plate 70B may include no joint part 73. Further, the metal shield plate 70B may have no hole 72.

Figure 3C:
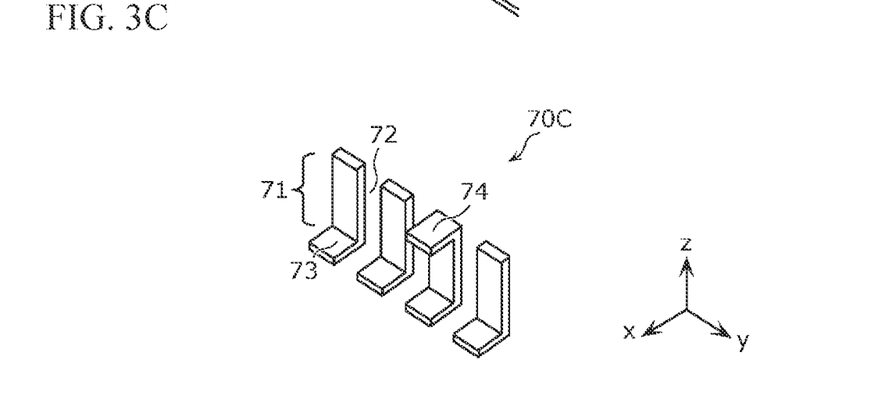
FIG. 3C is a perspective exterior view of a third example of the metal shield plate.

FIG. 3C is a perspective exterior view of a third example of the metal shield plate 70. A metal shield plate 70C illustrated in FIG. 3C is an example of the metal shield plate 70 according to the inventive example. As illustrated in FIG. 3C, the metal shield plate 70C includes a plurality of shield parts 71, a plurality of joint parts 73, and a joint part 74. Each of the shield parts 71 is an example of a body part of the metal shield plate 70C. The shield parts 71 extend in a direction perpendicular to the major face 91a (i.e., in the direction of the z-axis). In the metal shield plate 70C, the shield parts 71 are disposed discretely with a hole 72 interposed between adjacent shield parts 71, and the joint parts 73 are disposed discretely with the hole 72 interposed between adjacent joint parts 73. The joint part 74 is an example of a first joint part. The joint part 74 is parallel to the major face 91a and spaced apart from the major face 91a, and extends from the shield part 71. Each of the joint parts 73 is an example of a second joint part. The joint parts 73 are parallel to the major face 91a and spaced apart from the major face 91a, and extend from the corresponding shield parts 71. A hole 72 is provided between the major face 91a and the metal shield layer 95. The hole 72 penetrates the shield parts 71 in the direction of the normal to the shield parts 71 (i.e., in the direction of the x-axis).

The joint part 74 has a surface to which a bonding wire is joined. The joint part 74 is not in contact with the metal shield layer 95. The joint part 74 is thus connected by the bonding wire with a circuit component disposed over the major face 91a. This allows the joint part 74 to serve as a ground electrode for setting the circuit component to the ground potential. This in turn obviates the need to provide the ground electrode over the major face 91a. This results in reduced area required for laying out such a ground electrode over the major face 91a, which allows for miniaturization of the module substrate 91.

As described above, the metal shield plate 70C and the major face 91a are joined with each other by the joint parts 73. This improves the accuracy of placement of the metal shield plate 70C, and the strength of the joining between the metal shield plate 70C and the major face 91a. Further, the presence of the hole 72 helps to ensure, in forming the resin component 92 over the major face 91a, good flowability of liquid resin in the vicinity of the metal shield plate 70C. This in turn helps to reduce occurrence, in the vicinity of the metal shield plate 70C, of voids or other areas where no resin component 92 is present.

Although the metal shield plate 70C is necessarily required to include the shield parts 71 and the joint part 74, the metal shield plate 70C may have no joint part 73. Further, the metal shield plate 70C may have no hole 72.

Exemplary configurations of the metal shield plate 70 according to the inventive example are not limited to those of the metal shield plates 70A to 70C mentioned above. For example, the metal shield plate 70 may have a plurality of holes 72 extending from the major face 91a toward the metal shield layer 95. The joint part 73 does not necessarily extend in the positive direction of the x-axis as illustrated in FIGS. 3A to 3C, but may extend in the negative direction of the x-axis. Further, the metal shield plate 70 may include both the joint part 73 that extends in the positive direction of the x-axis and the joint part 73 that extends in the negative direction of the x-axis.

As illustrated in part (b) of FIG. 2, the metal shield plate 70 is connected at the major face 91a with the via-conductor 96. The metal shield plate 70 and the via-conductor 96 may be in direct contact with each other. Alternatively, as illustrated in part (b) of FIG. 2, the metal shield plate 70 and the via-conductor 96 may be connected with each other with a ground electrode 94g interposed therebetween, the ground electrode 94g being disposed over the major face 91a. Although not illustrated in FIG. 2, the metal shield plate 70 may be connected at its upper end with the metal shield layer 95.

According to the above-mentioned configuration of the metal shield plate 70, at least the lower end of the metal shield plate 70 is connected with ground. This allows for enhanced electromagnetic shielding function.

As illustrated in part (a) of FIG. 2, the metal shield plate 70 divides the major face 91a into a region P and a region Q. As illustrated in part (a) of FIG. 2, the power amplifier 10, the matching circuits 51 and 53, and the switch 41 represent an example of a first circuit component, and are disposed in the region P of the major face 91a. The low-noise amplifier 20, the duplexers 30 and 35, the matching circuits 50, 52, and 54, and the switches 40 and 42 represent an example of a second circuit component, and are disposed in the region Q of the major face 91a. The matching circuit 51 is disposed in the transmit path AT that connects the transmit input terminal 110 with the common terminal 40a of the switch 40. The matching circuit 51 includes a first inductor. The matching circuit 52 is disposed in the receive path AR that connects the receive output terminal 120 with the common terminal 40a of the switch 40. The matching circuit 52 includes a second inductor.

The low-noise amplifier 20 and the switch 42 may be included in a single semiconductor IC 60. This helps to reduce the area on the major face 91a required for mounting components. This allows for miniaturization of the radio-frequency module 1A. Further, the semiconductor IC 60 may include at least one of the switches 40 and 41.

That is, the metal shield plate 70 is disposed over the major face 91a and, with the module substrate 91 seen in plan view, between the first circuit component and the second circuit component.

According to the inventive example, the first circuit component is a circuit component disposed in the transmit path AT or BT, and the second circuit component is a circuit component disposed in the receive path AR, the receive path BR, or the transmit and receive path CTR.

The first circuit component disposed in the region P may be a circuit component disposed in the receive path AR or BR, and the second circuit component disposed in the region Q may be a circuit component disposed in the transmit path AT, the transmit path BT, or the transmit and receive path CTR.

The first circuit component disposed in the region P may be a circuit component disposed in the transmit and receive path CTR, and the second circuit component disposed in the region Q may be a circuit component disposed in the transmit path AT, the transmit path BT, the receive path AR, or the receive path BR.

As illustrated in FIG. 2, a ground electrode 61g disposed over a top face of the semiconductor IC 60, and the joint part 74 of the metal shield plate 70 are connected with each other by a bonding wire 81.

The top face of the semiconductor IC 60 refers to one of the opposite major faces of the semiconductor IC 60 that is located farther from the major face 91a than the other (i.e., on the positive side in the direction of the z-axis relative to the other).

According to the above-mentioned configuration, the presence of the metal shield plate 70 helps to reduce electromagnetic coupling between the first circuit component and the second circuit component. This in turn helps to reduce strong signal interference between the first circuit component and the second circuit component, and consequently allows for reduction of deterioration in the quality of a transmit signal or a receive signal.

As described above, the semiconductor IC 60 is connected with the joint part 74 by use of the bonding wire 81. As a result, a ground electrode for the semiconductor IC 60 does not need to be disposed over the major face 91a. This results in reduced area required for laying out such an electrode over the major face 91a, which allows for miniaturization of the module substrate 91. This therefore makes it possible to provide the radio-frequency module 1A that is compact, and that allows for reduced deterioration in the quality of a transmit signal or a receive signal.

It is desirable that the metal shield plate 70 be thicker than the metal shield layer 95. This makes it possible to enhance, relative to the capability to shield against extraneous noise, the capability to reduce leakage of radio-frequency noise generated in a circuit component of the radio-frequency module 1A into another circuit component of the radio-frequency module 1A.

It is desirable that the via-conductor 96 have an outside diameter greater than or equal to the thickness of the metal shield plate 70. If the outside diameter of the via-conductor 96 is less than the thickness of the metal shield plate 70, it is not possible to set the potential of the metal shield plate 70 strongly to the ground potential of the radio-frequency module 1A. The configuration according to the present example, by contrast, makes it possible to improve the ground of the metal shield plate 70. This results in the ability to reduce strong signal interference between two circuit components positioned across the metal shield plate 70 from each other. This in turn helps to improve the isolation between the transmit path, the receive path, and the transmit and receive path, and consequently allows for precise reduction of deterioration in the quality of a transmit signal or a receive signal.

A component to be connected with the joint part 74 by use of the bonding wire 81 is not limited to the semiconductor IC 60. The bonding wire 81 may provide connection between the joint part 74, and a ground electrode disposed over the top face of at least one of the first circuit component and the second circuit component. Desirably, one of the first circuit component and the second circuit component that is to be connected with the joint part 74 is a surface-mount electronic component.

The top face of the first circuit component refers to one of the opposite major faces of the first circuit component that is located farther from the major face 91a than the other (i.e., on the positive side in the direction of the z-axis relative to the other). The top face of the second circuit component refers to one of the opposite major faces of the second circuit component that is located farther from the major face 91a than the other (i.e., on the positive side in the direction of the z-axis relative to the other).

According to the inventive example, in particular, the first circuit component may be a first inductor, and the second circuit component may be a second inductor.

This helps to reduce electromagnetic coupling between the first inductor and the second inductor, and consequently reduce deterioration of reception sensitivity that may otherwise occur due to leakage, into the receive path, of the transmit signal at high output power amplified in the power amplifier, its harmonic waves, or spurious waves such as intermodulation distortion between the transmit signal and another radio-frequency signal.

According to the inventive example, in particular, the first circuit component may be the power amplifier 10, and the second circuit component may be the low-noise amplifier 20.

This helps to reduce electromagnetic coupling between the power amplifier 10 and the low-noise amplifier 20, and consequently reduce deterioration of reception sensitivity that may otherwise occur due to leakage, into the receive path, of the transmit signal at high output power amplified in the power amplifier, its harmonic waves, or spurious waves such as intermodulation distortion between the transmit signal and another radio-frequency signal.

3. Structure of Via-Conductor According to Modification

The structure of the via-conductor 96 is not limited to the one illustrated in FIG. 2 in which the via-conductor 96 extends all the way through from the major face 91a to the major face 91b.

Figure 4:
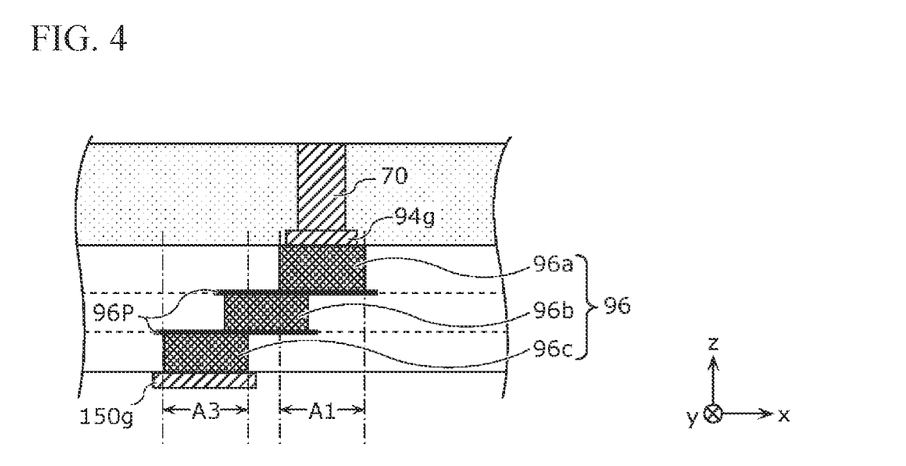
FIG. 4 is a cross-sectional view of a modification of a via-conductor.

FIG. 4 is a cross-sectional view of a modification of the via-conductor 96. As illustrated in FIG. 4, the via-conductor 96 includes a plurality of columnar conductors 96a, 96b, and 96c. The columnar conductors 96a, 96b, and 96c extend in a direction of the normal to the major faces 91a and 91b, and are in cascading connection with their gravity axes shifted relative to each other in the direction of the normal. The columnar conductor 96a, which is disposed furthest in the positive direction of the z-axis within the module substrate 91, is located in a region A1. The columnar conductor 96c, which is disposed furthest in the negative direction of the z-axis within the module substrate 91, is located in a region A3. With the module substrate 91 seen in plan view, the region A1 and the region A3 may have no overlap. That is, with the module substrate 91 seen in plan view, the via-conductor 96 according to the modification may have no region that overlaps all of the columnar conductors 96a to 96c. The columnar conductor 96a and the columnar conductor 96b are connected with each other with a conductor pattern 96P interposed therebetween and extending in the direction of the y-axis within the module substrate 91. The columnar conductor 96b and the columnar conductor 96c are connected with each other with the conductor pattern 96P interposed therebetween and extending in the direction of the y-axis within the module substrate 91.

4. Effects Etc

As described above, a radio-frequency module 1A according to the inventive example includes: a module substrate 91 having a major face 91a; a first circuit component and a second circuit component that are disposed over the major face 91a; and a metal shield plate 70 disposed over the major face 91a and set to a ground potential. The metal shield plate 70 includes a shield part 71 extending in a direction perpendicular to the major face 91a, and a joint part 74 parallel to the major face 91a and spaced apart from the major face 91a, the joint part 74 extending from the shield part 71. A top face of at least one of the first circuit component and the second circuit component is connected with the joint part 74 by a bonding wire 81. With the module substrate 91 seen in plan view, the metal shield plate 70 is disposed between the first circuit component and the second circuit component.

The above-mentioned configuration helps to reduce electromagnetic coupling between the first circuit component and the second circuit component. This in turn helps to reduce strong signal interference between the first circuit component and the second circuit component, and consequently allows for reduction of deterioration in the quality of a transmit signal or a receive signal. Since at least one of the first circuit component and the second circuit component is connected with the joint part 74 by use of the bonding wire 81, a ground electrode of the one of the first and second circuit components does not need to be disposed over the major face 91a. This results in reduced area required for laying out such an electrode over the major face 91a, which allows for miniaturization of the module substrate 91. This therefore makes it possible to provide the radio-frequency module 1A that is compact, and that allows for reduced deterioration in the quality of a transmit signal or a receive signal.

The radio-frequency module 1A further includes: a resin component 92 that covers the major face 91a, and at least part of the first circuit component and at least part of the second circuit component; and a metal shield layer 95 that covers a surface of the resin component 92, the metal shield layer 95 being set to a ground potential.

The above-mentioned configuration helps to improve the reliability of the first circuit component and the second circuit component such as mechanical strength and moisture resistance, and reduce entry of extraneous noise into the radio-frequency module 1A.

The radio-frequency module 1A may be configured such that: the metal shield plate 70 and the metal shield layer 95 are in contact with each other; and the metal shield plate 70 is thicker than the metal shield layer 95.

The above-mentioned configuration makes it possible to enhance, relative to the capability to shield against extraneous noise, the capability to reduce leakage of radio-frequency noise generated in a circuit component of the radio-frequency module 1A into another circuit component of the radio-frequency module 1A.

A hole 72 is provided between the metal shield plate 70 and the major face 91a, the hole 72 penetrating the shield part 71 in a direction of a normal to the shield part 71.

The radio-frequency module 1A may be configured such that a hole is provided between the metal shield plate 70 and the major face 91a, the hole penetrating the shield part 71 in a direction of a normal to the shield part 71.

The above-mentioned configuration helps to ensure, in forming the resin component 92 over the major face 91a, good flowability of liquid resin in the vicinity of the metal shield plate 70. This in turn helps to reduce occurrence, in the vicinity of the metal shield plate 70, of voids or other areas where no resin component 92 is present.

The radio-frequency module 1A may be configured such that: the metal shield plate 70 further includes a joint part 73 parallel to the major face 91a and in contact with the major face 91a, the joint part 73 extending from the shield part 71; and the joint part 73 is joined with a ground electrode 94g of the module substrate 91.

According to the above-mentioned configuration, the metal shield plate 70 and the major face 91a are joined with each other by the joint part 73. This improves the accuracy of placement of the metal shield plate 70, and the strength of the joining between the metal shield plate 70 and the major face 91a.

The radio-frequency module 1A may be configured such that: the radio-frequency module 1A further includes a via-conductor 96 disposed in the module substrate 91, the via-conductor 96 extending in a direction that crosses the major face 91a, the via-conductor 96 being set to a ground potential; the metal shield plate 70 is connected at the major face 91a with the via-conductor 96; and the via-conductor 96 has an outside diameter greater than or equal to a thickness of the metal shield plate 70.

The above-mentioned configuration helps to improve the ground of the metal shield plate 70. This results in the ability to reduce strong signal interference between two circuit components positioned across the metal shield plate 70 from each other. This in turn helps to improve the isolation between the transmit path, the receive path, and the transmit and receive path, and consequently allows for precise reduction of deterioration in the quality of a transmit signal or a receive signal.

The radio-frequency module 1A may be configured such that: the at least one of the first circuit component and the second circuit component is a surface-mount electronic component or a surface-mount semiconductor IC.

The above-mentioned configuration makes it possible to provide a ground electrode over the top faces of the surface-mount electronic component and the surface-mount semiconductor IC. This allows for connection with the joint part 74 by use of the bonding wire 81 with no ground electrode disposed over the major face 91a.

The radio-frequency module 1A may be configured such that: the radio-frequency module 1A further includes a power amplifier 10, and a low-noise amplifier 20; the first circuit component is a first inductor connected with an output terminal of the power amplifier 10; and the second circuit component is a second inductor connected with an input terminal of the low-noise amplifier 20.

The above-mentioned configuration helps to reduce electromagnetic coupling between the first inductor and the second inductor, and consequently reduce deterioration of reception sensitivity that may otherwise occur due to leakage, into the receive path, of the transmit signal at high output power amplified in the power amplifier, its harmonic waves, or spurious waves such as intermodulation distortion between the transmit signal and another radio-frequency signal.

The radio-frequency module 1A may be configured such that: the first circuit component is a power amplifier 10; the second circuit component is a low-noise amplifier 20; the low-noise amplifier 20 is included in a first semiconductor IC 60; and a top face of the first semiconductor IC 60 is connected with the joint part 74 by a bonding wire 81.

According to the above-mentioned configuration, the presence of the ground electrode 61g over the top face of the semiconductor IC 60 allows for connection with the joint part 74 by use of the bonding wire 81 with no ground electrode disposed over the major face 91a. This helps to improve the ground of the low-noise amplifier 20 while also allowing for miniaturization of the module substrate 91.

A communication apparatus 5 includes: an RFIC 3 that processes a radio-frequency signal transmitted and received by an antenna 2; and the radio-frequency module 1 that transfers the radio-frequency signal between the antenna 2 and the RFIC 3.

The above-mentioned configuration makes it possible to provide the communication apparatus 5 with reduced deterioration in the quality of a transmit signal or a receive signal.

OTHER EMBODIMENTS, ETC

Although the radio-frequency module and the communication apparatus according to the present disclosure have been described above by way of an embodiment, an inventive example, and a modification, the radio-frequency module and the communication apparatus according to the present disclosure are not limited to the embodiment, the inventive example, and the modification described above. The present disclosure is intended to encompass other embodiments implemented by combining any components in the embodiment, the inventive example, and the modification mentioned above, modifications obtained by modifying the embodiment, the inventive example, and the modification mentioned above in various ways as may become apparent to one skilled in the art without necessarily departing from the scope of the present disclosure, and various kinds of equipment incorporating the radio-frequency module and the communication apparatus.

For example, in the radio-frequency module 1A according to the inventive example, the constituent circuit components of the radio-frequency module 1A are disposed over one major face 91a of the module substrate 91. Alternatively, the circuit components may be disposed over the opposite major faces 91a and 91b of the module substrate 91 in a distributed fashion. That is, the constituent circuit components of the radio-frequency module 1A may be mounted over one side of the module substrate, or may be mounted over both sides of the module substrate.

For example, in the radio-frequency module and the communication apparatus according to the embodiment, the inventive example, and the modification mentioned above, other circuit elements, wiring, and other features may be inserted between paths that connect the circuit elements and the signal paths that are illustrated in the drawings.

INDUSTRIAL APPLICABILITY

The present disclosure is applicable to a wide variety of communication apparatuses such as mobile phones, as a radio-frequency module disposed in a multiband-compatible front-end part of such communication apparatuses.

REFERENCE SIGNS LIST 1, 1A radio-frequency module
2 antenna
3 radio-frequency integrated circuit (RFIC)
4 baseband integrated circuit (BBIC)
5 communication apparatus
10 power amplifier
15 PA control circuit
20 low-noise amplifier
30, 35 duplexer
31, 33 transmit filter
32, 34 receive filter
40, 41, 42 switch
40a, 41a, 42a common terminal
40b, 40c, 41b, 41c, 42b, 42c selection terminal
50, 51, 52, 53, 54 matching circuit
60 semiconductor IC
61g, 94g ground electrode
70, 70A, 70B, 70C metal shield plate
71, 71B shield part
72 hole
73, 74 joint part
81 bonding wire
91 module substrate
91a, 91b major face
92 resin component
95 metal shield layer
96 via-conductor
96a, 96b, 96c columnar conductor
96P conductor pattern
100 antenna connection terminal
110 transmit input terminal
120 receive output terminal
130 control signal terminal
150 external connection terminal
150g ground terminal
A1, A3 region
AR, BR receive path
AT, BT transmit path
CTR transmit and receive path
P, Q region

The invention claimed is:

1. A radio-frequency module comprising:
a module substrate comprising a major face;
a first circuit component and a second circuit component that are disposed over the major face;
a metal plate disposed over the major face and set to a ground potential; and
a via-conductor disposed in the module substrate, the via-conductor extending in a direction that crosses the major face, the via-conductor being set to the ground potential,
wherein the metal plate includes:
  a body part extending in a direction perpendicular to the major face, and
  a first joint part parallel to the major face and spaced apart from the major face, the first joint part extending from the body part,
wherein a top face of at least one of the first circuit component and the second circuit component is connected with the first joint part by a bonding wire,
wherein with the module substrate seen in plan view, the metal plate is disposed between the first circuit component and the second circuit component,
wherein the metal plate is connected at the major face with the via-conductor, and
wherein the via-conductor has an outside diameter that is greater than or equal to a thickness of the metal plate.

2. The radio-frequency module according to claim 1, further comprising:

a resin component that covers the major face, at least part of the first circuit component, and at least part of the second circuit component; and a metal layer that covers a surface of the resin component, the metal layer being set to the ground potential.

3. The radio-frequency module according to claim 2, wherein the metal plate and the metal layer are in contact with each other, and wherein the metal plate is thicker than the metal layer.

4. The radio-frequency module according to claim 3, further comprising a hole between the metal plate and the major face, the hole penetrating the body part in a normal direction relative to the body part.

5. The radio-frequency module according to claim 3, wherein the metal plate further comprises:

a second joint part parallel to the major face and in contact with the major face, the second joint part extending from the body part, and wherein the second joint part is joined with a ground electrode of the module substrate.

6. The radio-frequency module according to claim 2, further comprising a hole between the metal plate and the major face, the hole penetrating the body part in a normal direction relative to the body part.

7. The radio-frequency module according to claim 2, wherein the metal plate further comprises:

a second joint part parallel to the major face and in contact with the major face, the second joint part extending from the body part, and wherein the second joint part is joined with a ground electrode of the module substrate.

8. The radio-frequency module according to claim 2, wherein the at least one of the first circuit component and the second circuit component comprises a surface-mount electronic component or a surface-mount semiconductor integrated circuit (IC).

9. The radio-frequency module according to claim 1, further comprising a hole between the metal plate and the major face, the hole penetrating the body part in a normal direction relative to the body part.

10. The radio-frequency module according to claim 9, wherein the metal plate further comprises:

a second joint part parallel to the major face and in contact with the major face, the second joint part extending from the body part, and wherein the second joint part is joined with a ground electrode of the module substrate.

11. The radio-frequency module according to claim 1, wherein the metal plate further comprises:

a second joint part parallel to the major face and in contact with the major face, the second joint part extending from the body part, and wherein the second joint part is joined with a ground electrode of the module substrate.

12. The radio-frequency module according to claim 1, wherein the at least one of the first circuit component and the second circuit component comprises a surface-mount electronic component or a surface-mount semiconductor integrated circuit (IC).

13. The radio-frequency module according to claim 1, further comprising:

a power amplifier; and a low-noise amplifier, wherein the first circuit component comprises a first inductor connected with an output terminal of the power amplifier, and wherein the second circuit component comprises a second inductor connected with an input terminal of the low-noise amplifier.

14. The radio-frequency module according to claim 1, wherein the first circuit component comprises a power amplifier, wherein the second circuit component comprises a low-noise amplifier, wherein the low-noise amplifier is included in a first semiconductor integrated circuit (IC), and wherein a top face of the first semiconductor IC is connected with the first joint part by a bonding wire.

15. A communication apparatus comprising:

a radio-frequency integrated circuit that is configured to process a radio-frequency signal transmitted and received by an antenna; and the radio-frequency module according to claim 1 that is configured to propagate the radio-frequency signal between the antenna and the radio-frequency integrated circuit.

* * * * *